United States Patent [19]

Ochii et al.

[11] Patent Number: 4,901,284
[45] Date of Patent: Feb. 13, 1990

[54] STATIC RANDOM ACCESS MEMORY

[75] Inventors: Kiyofumi Ochii, Yokohama; Masataka Matsui, Tokyo; Osamu Ozawa, Yokohama, all of Japan

[73] Assignee: Kabushiki Kaisha Toshiba, Kawasaki, Japan

[21] Appl. No.: 288,198

[22] Filed: Dec. 22, 1988

[30] Foreign Application Priority Data

Dec. 23, 1987 [JP] Japan ................................. 62-325687

[51] Int. Cl.$^4$ ........................ G11C 13/00; G11C 11/40
[52] U.S. Cl. .................................. 365/226; 365/154; 365/189.01
[58] Field of Search .............. 365/226, 227, 154, 185, 365/189.01, 189.09

[56] References Cited

U.S. PATENT DOCUMENTS 4,794,571 12/1988 Uchida ................................. 365/226

Primary Examiner—Terrell W. Fears
Attorney, Agent, or Firm—Finnegan, Henderson, Farabow, Garrett and Dunner

[57] ABSTRACT

A static random access memory comprising a memory cell array, a plurality of peripheral circuits, first and second power-supply voltage lines, a bonding pad, and a level-shifting circuit. The array has static memory cells each having resistors functioning as load elements. The peripheral circuits control the writing of data into, and the reading of data from, the static memory cells. The first power-supply voltage line applies a first power-supply voltage to the peripheral circuits. The bonding pad is connected to the first power-supply voltage line. The second power-supply voltage line applies a second power-supply voltage to the static memory cells. The level-shifting means is connected between the first and second power-supply voltage lines, for shifting the level of the first power-supply voltage and applying the level-shifted voltage to the static memory cells via said second power-supply voltage line.

9 Claims, 8 Drawing Sheets

| MEMORY CAPACITY | 256M | 1M | 4M | 16M |
|---|---|---|---|---|
| RESISTANCE | 1 TERAΩ | 4 TERAΩ | 16 TERAΩ | 64 TERAΩ |

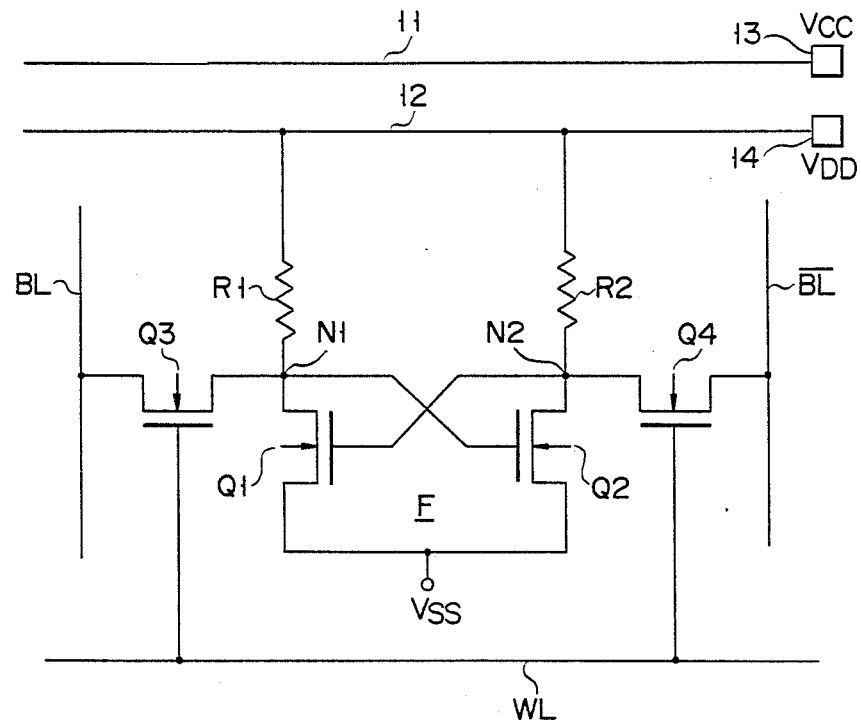
F I G. 5

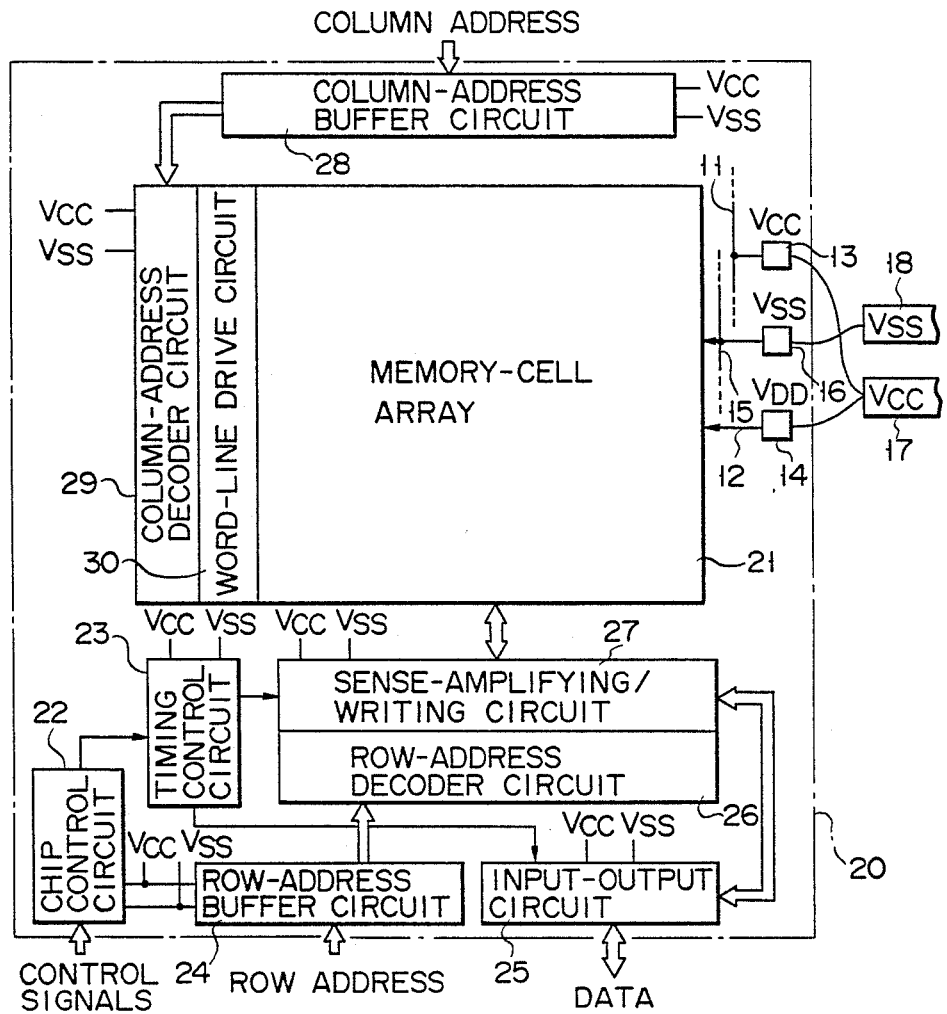
F I G. 6

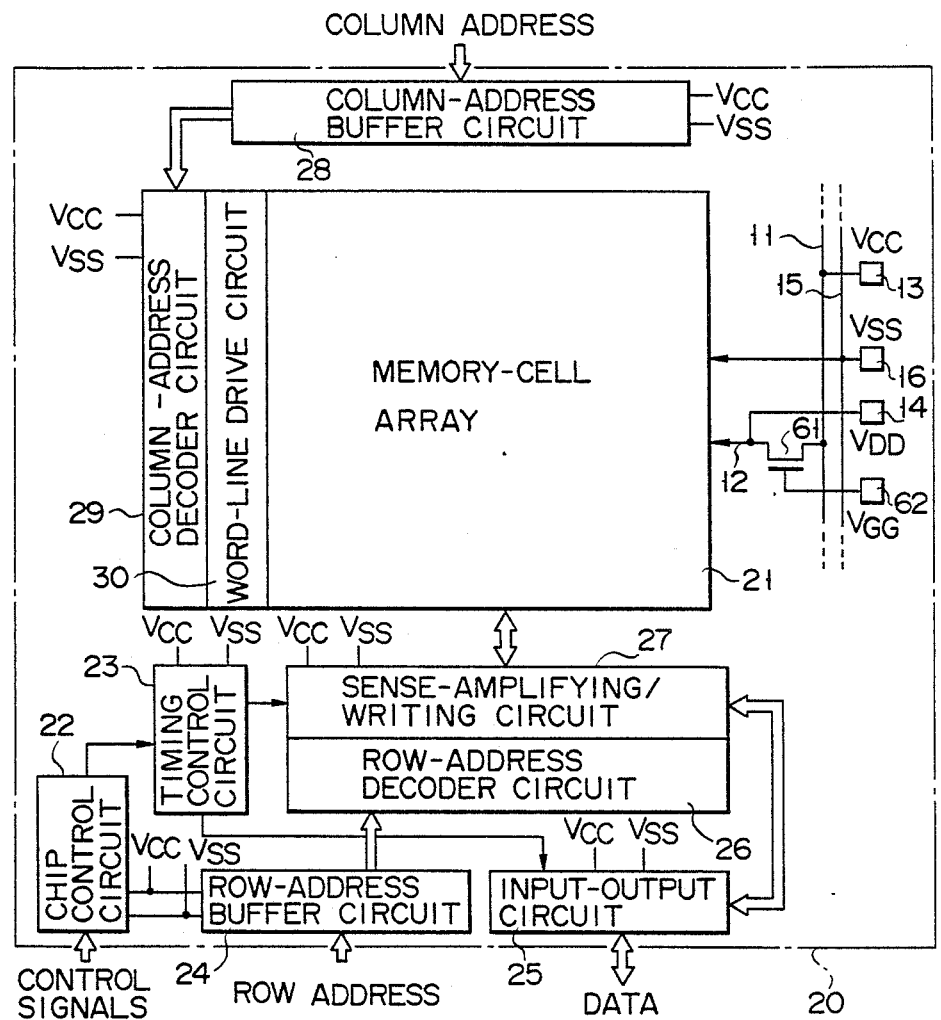
F I G. 8

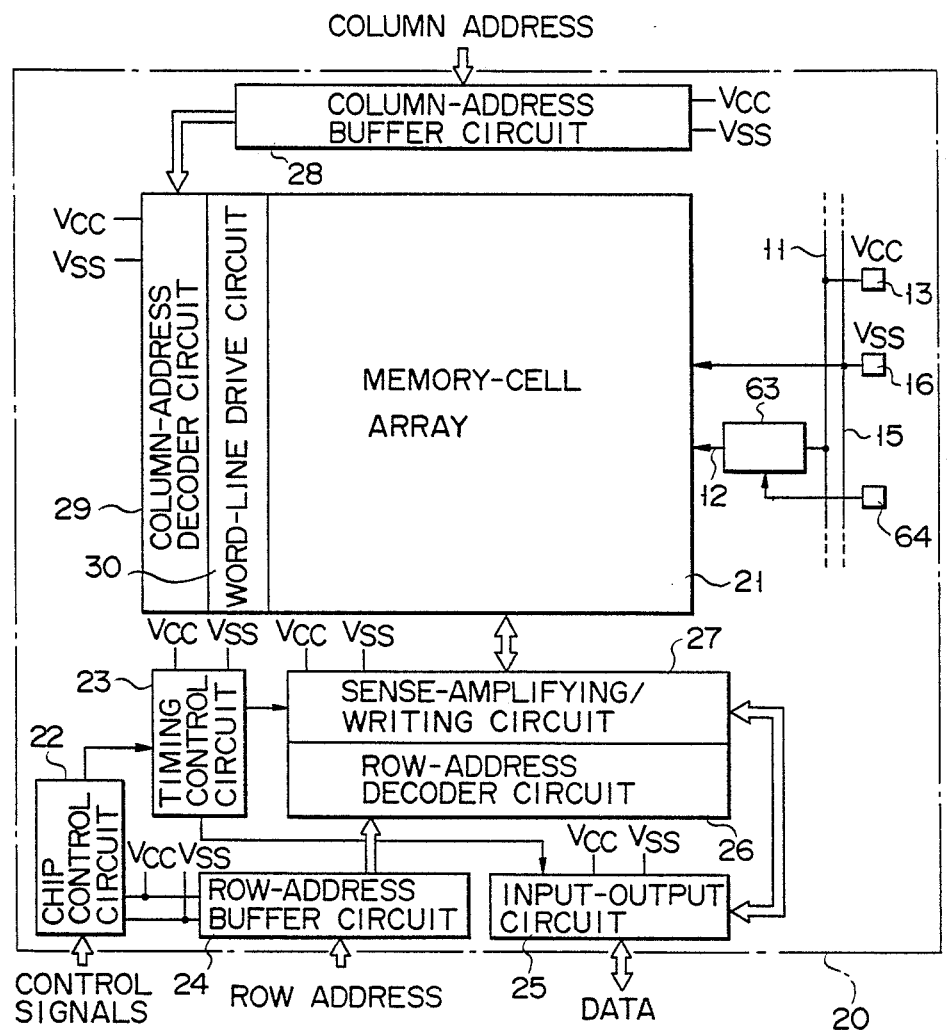
F I G. 9

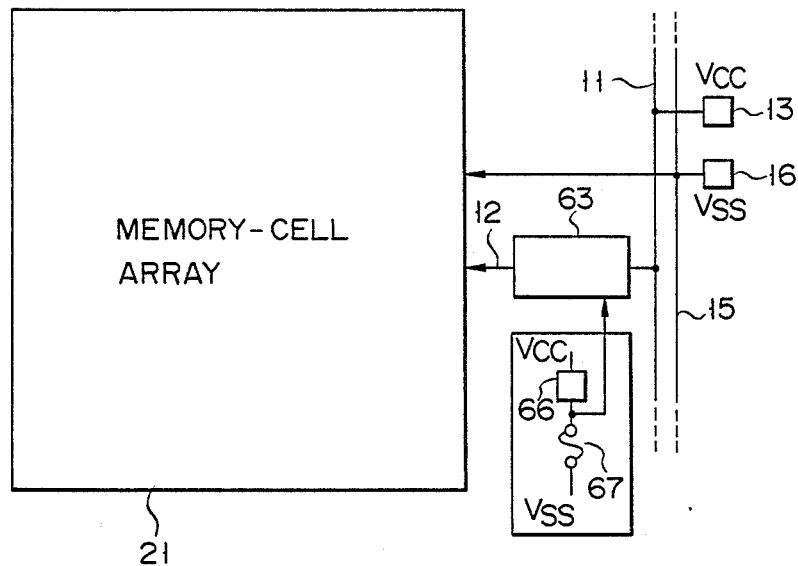
F I G. 10

STATIC RANDOM ACCESS MEMORY

BACKGROUND OF THE INVENTION

1. Field of the Invention

The present invention relates to a static random access memory having high-resistance elements made of polycrystalline silicon and used as load elements within memory cells, and more particularly, to a static random access memory provided with a means for detecting defective memory cells having leakage current, if any.

2. Description of the Related Art

An E/R type static random-access memory cell (E/R type SRAM cell) is known. As is understood from the equivalent circuit diagram shown in FIG. 1, this memory cell comprises a flip-flop circuit. The flip-flop circuit is comprised of two inverters, each having one high-resistance element which is used as a load element, and one enhancement type MOS transistor which functions as a drive element. The input and output of the first inverter are connected to the output and input of the second transistor, respectively. More specifically, high-resistance elements R1 and R2 are coupled, at one end, to power-supply voltage $V_{CC}$, and at the other end, to the drains of MOS transistors Q1 and Q2, respectively. The sources of MOS transistors Q1 and Q2 are ground voltage $V_{SS}$. The gate of transistor Q1 is coupled to the drain of transistor Q2, and the gate of transistor Q2 is coupled to the drain of transistor Q1. Hence, high-resistance elements R1 and MOS transistor Q1 form an inverter, and high-resistance elements R2 and MOS transistor Q2 form another inverter. These inverters have their input and output connected to each other's output and input, respectively, whereby the inverters constitute flip-flop circuit F.

As is illustrated in FIG. 1, MOS transistors Q3 and Q4 are used as transfer gates for controlling data-writing and data-reading. MOS transistor Q3 is connected between memory node N1 of flip-flop circuit F and bit line BL. MOS transistor Q4 is coupled between memory node N2 of flip-flop circuit F and bit line $\overline{BL}$. The gate of both MOS transistors Q3 and Q4 are coupled to word line WL. All transistors Q1 to Q4 are of enhancement type.

The flip-flop circuit F, which is the main component of the memory cell, is a bistable one. Therefore, two data items complemental to each other are stored in memory nodes N1 and N2. Assuming that data items, i.e., "1" and "0", are stored in nodes N1 and N2, respectively, transistor Q1 is off, and transistor Q2 is on. Since high-resistance elements R1 and R2 are linear passive elements, a current flows through high-resistance element R2 coupled to transistor Q2 which is on. The resistance of high-resistance element R2 is far higher than that of on-resistance of transistor Q2. Hence, the resistance of element R2 determines the value of the current flowing through transistors Q2. A similar current flows in each of the E/R type SRAM cells forming a static random access memory (SRAM), and the sum of the currents flowing through all E/R type SRAM cells determines the SRAM in its static condition.

Also well known are completely CMOS SRAM cells, each comprising six transistors, two of which are P-channel MOS transistors functioning as load elements. The two P-channel MOS transistors, which are used as load elements, are active elements. Therefore, the memory cell of FIG. 1 can be made of four MOS transistors and two resistors, and occupies but less area than a fully CMOS memory cell. However, this memory cell is disadvantageous in that a current flows via both high-resistance elements R1 and R2 as long as the cell in the static condition. To reduce this current flowing through elements R1 and R2, these high-resistance elements can be replaced with resistors which have higher resistances. However, when elements R1 and R2 are replaced by such resistors, the flip-flop F may operate unstably, inevitably destroying the data stored in the E/R type SRAM cell, as will be explained below.

FIG. 2 is a table showing the various resistances which elements R1 and R2 of each E/R type SRAM cell of an E/R type SRAM must have to maintain the current, which flows through the cell in the static condition, at the typical value of 1 μA, in accordance with the memory capacity of the E/R type SRAM. As may be understood from FIG. 1, memory nodes N1 and N2 exist in the PN junction between a P-type substrate and an N+ diffusion region which is the common drain of transistors Q1 and Q2. The reverse leakage current flowing in this PN junction is about $10^{-14}$ A. This value is equivalent to resistance of about 100 tera Ω. In the case of a 256 K-bit memory, the resistance of either high-resistance element, R1 or R2 is 100 times the resistance equivalent to the reverse leakage current flowing in the PN junction. In the case of a 1 M-bit memory, the resistance is 25 times the resistance which is equivalent to the reverse leakage current. The greater the ratio of the resistance of either high-resistance element, the larger the operation margin of each memory cell. As is evident from FIG. 2, this operation margin is inversely proportional to the capacity of the memory.

What has been explained in the preceding paragraph only applies to the case where no abnormal leakage currents flow in the PN junction connected to both memory nodes N1 and N2. In actuality, both a defective leakage current and a contaminating leakage current are generated in the PN junction. When these abnormal leakage currents are far greater than the currents flowing via high-resistance elements R1 and R2, neither memory node can no longer hold the data item "1", and the flip-flop circuit F ceases to function, and hence the E/R type SRAM cell having this flip-flop circuit F cannot correctly function. Any SRAM chip, if containing such a defective memory cell, can no longer function at all. Needless to say, the presence of such defective memory cells reduces the yield of SRAM chips.

On the hand, when the abnormal leakage currents are nearly equal to the currents flowing through high-resistance elements R1 and R2, the voltage applied on the memory node storing the data item "1" falls to the value determined by the division of resistance achieved by high-resistance elements R1 and R2 and also by the resistance equivalent to the abnormal leakage current. Consequently, flip-flop circuit F becomes very unstable, and the memory cell, as a whole, inevitably operates unstably. Any SRAM which includes such a defective memory cell has neither a sufficient margin for power-supply voltage nor a sufficient margin for temperature changes. Unless the defective memory cell is detected, and any appropriate measures are taken for the cell, the data stored in this defective cell will be destroyed eventually.

Here arises a problem. It is extremely difficult to detect a defective memory in the SRAM. As is known in the art, it takes a long period of time to complete the test for screening an inadequate operation margin or a defect which needs a long time to detect. In some cases, it is necessary to set the ambient temperature at various values to carry out this test successfully. In the worst case, the insufficient operation margin or the defect may not be found even if the test has been carried out for a considerably long time.

FIG. 3 is an equivalent circuit diagram showing the flip-flop circuit of an E/R type SRAM cell which is identical to the SRAM cell shown in FIG. 1, except that memory nodes N1 and N2 have a leakage-current path each. Resistors Rj and Rj' shown in this figures are equivalent to the leakage-current paths. More precisely, resistance Rj exists only when a reverse leakage current of a normal value flows through the PN junction coupled to memory node N1, whereas resistance Rj' exists only when a leakage current of an abnormal value flows through the PN junction connected to memory node N2.

The typical temperature characteristics of resistors R1, R2, Rj, and Rj' are illustrated in FIG. 4. As can be understood from FIG. 4, the energy for activating high-resistance elements R1 and R2, each formed of a polycrystalline silicon layer, is great, and the temperature dependency of either high-resistance element is prominent. The resistance of resistor Rj is determined by the junction area of memory node N1, and is about 100 tera $\Omega$. The temperature dependency of resistor Rj is less than that of high-resistance elements R1 and R2. Resistor Rj' has a resistance which is the sum of the resistance of resistor Rj and the resistance equivalent to the abnormal leakage current flowing through the PN junction. As is evident from FIG. 4, the line representing the temperature characteristic of resistor Rj' crosses the line representing the temperature characteristic of resistor Rj at a specific temperature T1 if the resistance of resistor Rj' is about hundreds of times lower than that of resistor Rj, said specific temperature T1 falling within the range in which the memory cell can correctly perform its function. In other words, resistor Rj' has the same resistance as elements R1 and R2 at temperature T1. Its has a resistance lower than that of high-resistance elements R1 and R2 at any temperature below T1, and a resistance higher than that of elements R1 and R2 at any temperature above T1.

The voltage at which memory nodes N1 and N2 hold data when the memory cell is in its static condition will now be calculated. The voltage V1(1) which node N1 requires to hold data "1" can be given:

$$V1(1) = \left\{ \left( \frac{Rj \cdot Rn(\text{off})}{Rj + Rn(\text{off})} \right) \bigg/ \left( \frac{Rj \cdot Rn(\text{off})}{Rj + Rn(\text{off})} + R1 \right) \right\} \cdot V_{cc} \quad (1)$$

The voltage V2(1) which node N2 requires to hold data "1" can be given:

$$V2(1) = \left\{ \left( \frac{Rj' \cdot Rn(\text{off})}{Rj' + Rn(\text{off})} \right) \bigg/ \left( \frac{Rj' \cdot Rn(\text{off})}{Rj' + Rn(\text{off})} + R2 \right) \right\} \cdot V_{cc} \quad (2)$$

The voltage V1(0) which node N1 requires to hold data "0" can be given:

$$V1(0) = \quad (3)$$

$$\left\{ \left( \frac{Rj \cdot Rn(\text{on})}{Rj + Rn(\text{on})} \right) \bigg/ \left( \frac{Rj \cdot Rn(\text{on})}{Rj + Rn(\text{on})} + R1 \right) \right\} \cdot V_{cc}$$

The voltage V2(0) which node N2 requires to hold data "0" can be given:

$$V2(0) = \quad (4)$$

$$\left\{ \left( \frac{Rj' \cdot Rn(\text{on})}{Rj' + Rn(\text{on})} \right) \bigg/ \left( \frac{Rj' \cdot Rn(\text{on})}{Rj' + Rn(\text{on})} + R2 \right) \right\} \cdot V_{cc}$$

In the above equations (1) to (4), Rn(off) is the resistance equivalent to the channel leakage current which flows when transistors Q1 and Q2 of flip-flop circuit F are off, Rn(on) is the resistance equivalent to the channel current which flows when transistors Q1 and Q2 are on. Any transistor has Rn(off) as high as $10^{14} \Omega$ or more if operating correctly. Hence, equations (1) to (4) can reduce to:

$$V1(1) \approx V_{CC} \quad (5)$$

$$V2(1) \approx \frac{Rj'}{Rj' + R2} \cdot V_{CC} \quad (6)$$

$$V1(0) = V2(0) \approx 0 \quad (7)$$

It is desirable that the voltages which each memory cell requires to store data "1" and data "0" be $V_{CC}$ and 0 V, respectively. Voltage V2(1), at which memory node N2 holds data "1", is determined by Rj'/(R2+Rj'), and is lower than $V_{CC}$. The lower Rj' is than R2, the more does voltage V2(1) fall. When voltage V2(1) falls below the threshold voltage Vthn of each N-channel MOS transistor, Rn(on), one of the terms of equation (3), changes to Rn(off). Consequently, voltage V1(0), at which memory node N1 holds data "0", will rise to $V_{CC}$ with time constant of R1·CA (where CA is the capacitance present in memory node N1). That is, data "0" held by node N1 has changed to "1", whereas data "1" held by node N2 has changed to "0". This is the destruction of data. In terms of the temperature characteristics shown in FIG. 4, the data is destroyed at temperature T1 or any lower temperature. This destruction of data is, hence, called "leakage induced cell destruction at low-temperature."

A SRAM memory cell which has undergone low-temperature pause destruction can hardly be detected unless the SRAM chip is tested not only at room temperature, but also at other various temperatures. It takes an extremely long time to test the SRAM chip at various temperatures, for a memory cell, if any, which has undergone leakage induced cell destruction at low-temperature. Obviously, it is uneconomical to spend much time on testing each SRAM chip. Further, a SRAM cell repeats unstable operation several times until the data stored in it is destroyed completely. This unstable operation of the cell is very hard to detect within a short time of period. Accordingly, demands have been made for means which can text a wafer having a number of SRAM chips, to determine quickly whether or not each SRAM chip contains any defective memory cell.

Hitherto, in order to detect defective memory cells, if any, contained in a SRAM chip, the operation characteristics of all cells of the SRAM chip are externally examined. This method can hardly be successful and requires a very long time to test the SRAM chip.

SUMMARY OF THE INVENTION

It is the object of the present invention to provide a static random access memory which has a means capable of detecting defective memory cells having leakage current, if any, both easily and quickly.

According to an aspect of the invention, there is provided a static random access memory comprising: an array of static memory cells each having resistors functioning as load elements; peripheral circuits for controlling the writing of data into, and the reading of data from, the static memory cells; a first power-supply voltage line for applying a first power-supply voltage to the peripheral circuits; a bonding pad connected to the first power-supply voltage line; a second power-supply voltage line for applying a second power-supply voltage to the static memory cells; and level-shifting means connected between the first and second power-supply voltage lines, for shifting the level of the first power-supply voltage and applying the level-shifted voltage to the static memory cells via said second power-supply voltage line.

According to another aspect of the invention, there is provided a static random access memory comprising: an array of static memory cells each having resistors functioning as load elements; peripheral circuits for controlling the writing of data into, and the reading of data from, the static memory cells; a first power-supply voltage line for applying a first power-supply voltage to the memory cells of said array; a second power-supply voltage line for applying a second power-supply voltage to the peripheral circuits; a first bonding pad connected to the first power-supply voltage line; and a second bonding pad connected to the second power-supply voltage line.

BRIEF DESCRIPTION OF THE DRAWINGS

FIG. 5 is a circuit diagram illustrating each memory cell of the memory according to a first embodiment of the present invention;

FIG. 6 is a block diagram showing the first embodiment of the invention;

FIG. 8 is a block diagram showing the E/R-type SRAM according to a second embodiment of the present invention;

FIG. 9 is a block diagram showing the E/R-type SRAM according to a third embodiment of the present invention; and FIG. 10 is a block diagram showing part of the E/R-type SRAM according to a fourth embodiment of the present invention.

DETAILED DESCRIPTION OF THE PREFERRED EMBODIMENTS

Figures 1, 2:
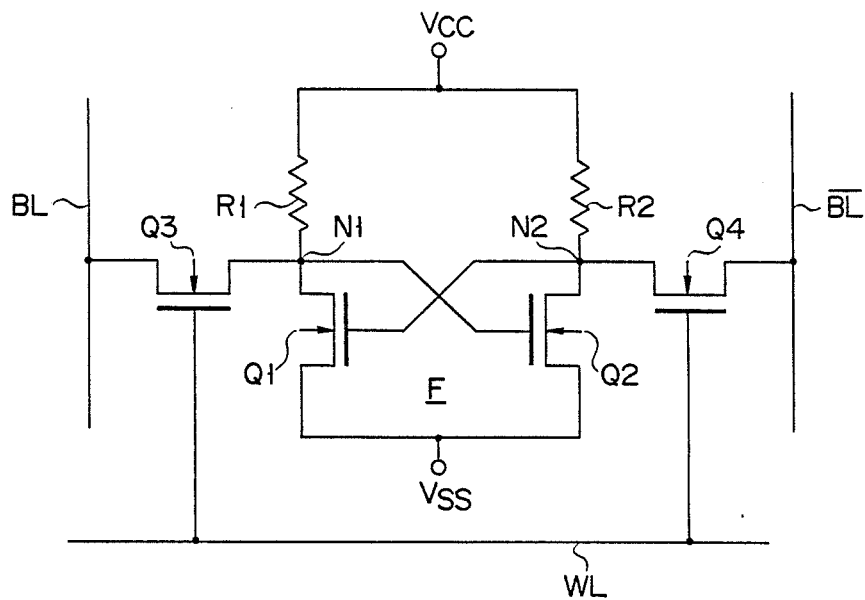
FIG. 1 is an equivalent circuit diagram showing an E/R-type SRAM cell.
FIG. 2 is a table showing the relationship between the memory capacity of an E/R-type SRAM and the resistance of the high-resistance elements used in each memory cell of the E/R-type SRAM.

FIG. 5 shows one of the memory cells forming the cell array incorporated in a static random access memory according to the present invention. Like the memory cell shown in FIG. 1, this memory cell comprises four enhancement-type MOS transistors Q1 to Q4, and two high-resistance resistors R1 and R2. Transistors Q1 and Q2 are connected such that they form a flip-flop circuit F. The common source of these MOS transistors Q1 and Q2 is connected to ground voltage $V_{SS}$. MOS transistors Q3 and Q4, which are used as transfer gates, have their gates connected to word line WL. These transistors Q3 and Q4 are connected, at one end, to bit lines BL and $\overline{BL}$, respectively.

The memory has two power-supply voltage lines 11 and 12. Lines 11 and 12 are connected to bonding pads 13 and 14. Power-supply voltage $V_{CC}$ is applied to bonding pad 13, and power-supply voltage $V_{DD}$ is applied to bonding pad 14. High-resistance resistors R1 and R2 are coupled, at one end, to line 12 for applying power-supply voltage $V_{DD}$. Peripheral circuits is connected to line 11 for applying power-supply voltage $V_{CC}$. This circuit is used to control the writing of data and the reading of data from, the memory cell, as will be described later in detail.

The power-supply voltage $V_{DD}$ applied to bonding pad 14 is lower than the power-supply voltage $V_{CC}$ in order to determine whether or not the memory cell has suffered leakage induced cell destruction at low-temperature, and is equal to the power-supply voltage $V_{CC}$ in order to make the memory cell perform its function. In other words, two different voltages are applied to bonding pads 13 and 14 to test the memory cell, and the same voltage, i.e., $V_{CC}$, is applied to both bonding pads 13 and 14 after the test.

Figure 3:
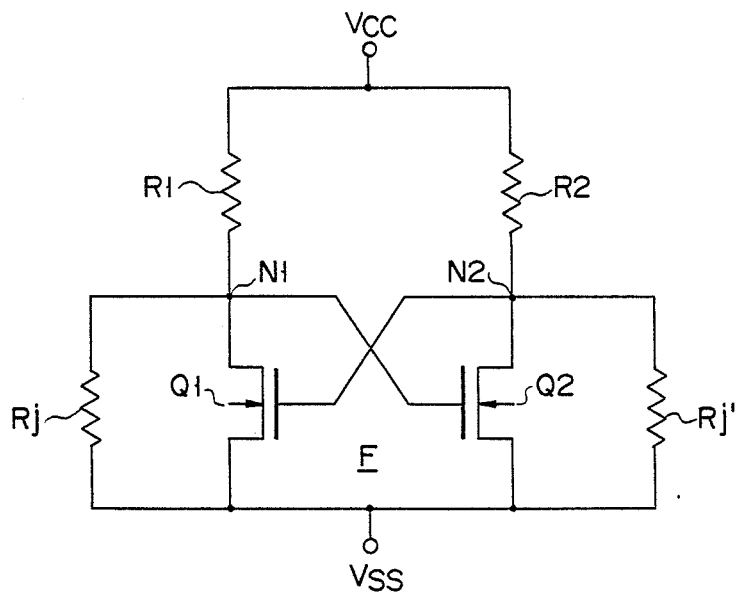
FIG. 3 is an equivalent circuit diagram showing part of the E/R-type SRAM cell illustrated in FIG. 1.
Figure 4:
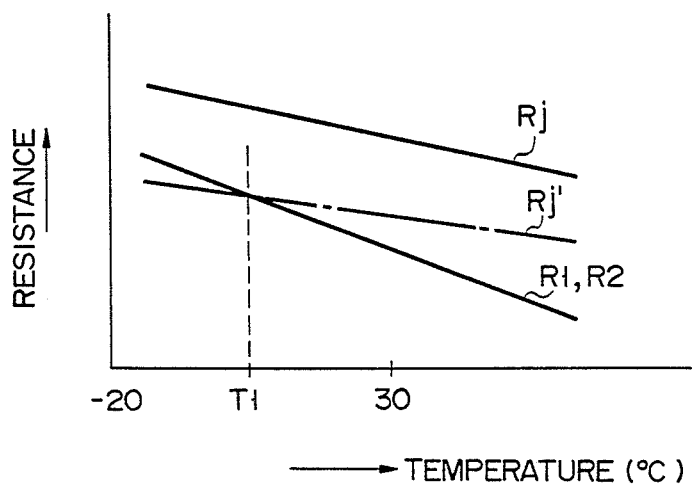
FIG. 4 is a diagram representing the temperature characteristics of the various resistors incorporated in the E/R-type SRAM cell shown in FIG. 1.

That part of the equivalent circuit diagram shown in FIG. 5, which illustrates the flip-flop F is identical to the corresponding part of FIG. 3, provided that a reverse leakage current of the PN junction flows through memory node N1, and a reverse leakage current containing an abnormal leakage component flows through memory node N2.

The SRAM chip having memory cells identical to the cell shown in FIG. 5 is tested in the following way. First, the power-supply voltage $V_{DD}$, which is equal to the power-supply voltage $V_{CC}$ is applied to bonding pad 14, so that the memory cell can operate. At the same time, the power-supply voltage $V_{CC}$ is applied to bonding pad 13, so that the peripheral circuits operate. Specified data is written into the memory cell by the method knon in the art. More specifically, bit lines BL and $\overline{BL}$ are respectively set to the "0" potential and the "1" potential, or vice versa. As a result, MOS transistors Q3 and Q4, functioning as transfer gates, are turned on by the signal on the word line WL. Memory nodes N1 and N2 are set to the potentials of the bit lines BL and $\overline{BL}$, respectively. Then, the flip-flop circuit F maintain both potentials stably. Hence, the memory cell stores the specified data.

Thereafter, the power-supply voltage $V_{DD}$, applied to bonding pad 14, is lowered below the power-supply voltage $V_{CC}$. Voltages V1(1) and V1(0), which memory node N1 requires to hold data items "1" and "0", and voltages V2(1) and V2(0) which memory node N2 requires to hold data items "1" and "0", changes to the following values:

$$V1(1) = V_{DD} \quad (8)$$

$$V2(1) = \frac{Rj'}{Rj' + R2} \cdot V_{DD} \quad (9)$$

$$V1(0) \approx 0 \quad (10)$$

$$V2(0) \approx 0 \quad (11)$$

Since $V_{DD} < V_{CC}$, the voltage V2(1) containing an abnormal leakage component is lower than in the case where voltage $V_{CC}$ is applied to high-resistance resistors R1 and R2. The power-supply voltage $V_{CC}$ is applied via power-supply voltage line 11 to the peripheral circuits including a sense amplifier for detecting the bit-line potential. Therefore, it can easily be determined whether or not the memory cell has undergone leakage induced cell destruction at low-temperature due to the fall of the voltage V2(1), merely by applying a voltage lower than the voltage $V_{CC}$, as the power-supply voltage $V_{DD}$, to high-resistance resistors R1 and R2. This is because the destruction of the data stored in the memory cell starts when the voltage V2(1) falls below the threshold voltage of the N-channel MOS transistors, and the voltage applied to resistors R1 and R2 is lower than the voltage $V_{CC}$ and, hence, accelerates the destruction of the data stored in the memory cell.

After the destruction of the data stored in the memory cell has been accelerated, the voltage $V_{DD}$ applied to bonding pad 14 is set to the same value as voltage $V_{CC}$. Then, the data is read from the memory cell. The data stored in this cell remains unchanged even when the voltage applied via power-supply voltage line 12 is set to the voltage $V_{CC}$ again. Hence, if the data read from the memory cell is different from the data previously written into the cell, it is determined that this memory cell has undergone leakage induced cell destruction at low-temperature. To detect the defective memory cell it suffices to change the voltage applied to bonding pad 14. Therefore, the detection of such defective memory cells can be achieved within a far shorter time than is possible in the case of the conventional E/R type SRAM. Since the data stored in each memory cell can also be destroyed when the power-supply voltage is high, a voltage higher than the voltage $V_{CC}$ can be applied to bonding pad 14, thereby to test the memory cells of the E/R type SRAM.

FIG. 6 is a block diagram illustrating SRAM chip 20 according to the present invention, which has memory cells identical to the one shown in FIG. 5. More specifically, SRAM chip 20 comprises array 21 of memory cells (FIG. 5), and various peripheral circuits for controlling the writing of data into, and the reading of data from, each of the memory cells. Among these peripheral circuits, mostly known in the art, are: chip control circuit 22, timing control circuit 23, row-address buffer circuit 24, input-output circuit 25, row-address decoder circuit 26, sense-amplifying-writing circuit 27, column-address buffer circuit 28, column-address decoder circuit 29, and word-line drive circuit 30. Chip control circuit 22 is connected to receive various control signals such as a chip-enable signal and an output-enable signal. Timing control circuit 23 generates timing signals in response to the signal output by chip control circuit 22. Row-address buffer circuit 24 is connected to store rowaddresses. Input-output circuit 25 is designed to input data to SRAM chip 20 and output data therefrom. Row-address decoder circuit 26 decodes the row-address data output by row-address buffer circuit 24. Sense-amplifying/writing circuit 27 is used to write data into memory-cell array 21 and also to read data from memory-cell array 21. Column-address buffer circuit 28 is connected to store column addresses. Column-address decoder circuit 29 decodes any column-address data output by column-address buffer circuit 28. Word-line drive circuit 30 drives the word lines provided in memory-cell array 21, in accordance with the data output by column-address decoder circuit 29.

As is shown in FIG. 6, SRAM chip 20 further comprises power-supply voltage line 11, power-supply voltage line 12, bonding pads 13 and 14, power-supply voltage line 15, and bonding pad 16. Line 11 is used to apply the power-supply voltage $V_{CC}$ to the peripheral circuits provided outside memory-cell array 21. Line 12 is provided for applying the power-supply voltage $V_{DD}$ to the memory cells of array 21. Bonding pads 13 and 14 are connected to lines 11 and 12, for receiving the power-supply voltages $V_{CC}$ and $V_{DD}$, respectively. Line 15 is provided for applying the ground voltage $V_{SS}$ to the memory cells and also to the peripheral circuits. Bonding pad 16 is coupled to line 15, for receiving the ground voltage $V_{SS}$.

In order to test memory-cell array 21, different predetermined voltages are applied to bonding pads 13, 14, and 16, with these pads not connected to lead frames by bonding wires. Upon completion of the test, bonding pads 13 and 14 are connected the $V_{CC}$ lead frame 17 by means of a bonding wires as is illustrated in FIG. 6. Then, bonding pad 16 is connected to the $V_{SS}$ lead frame 18 by means of a bonding wire.

Figures 7A, 7B:
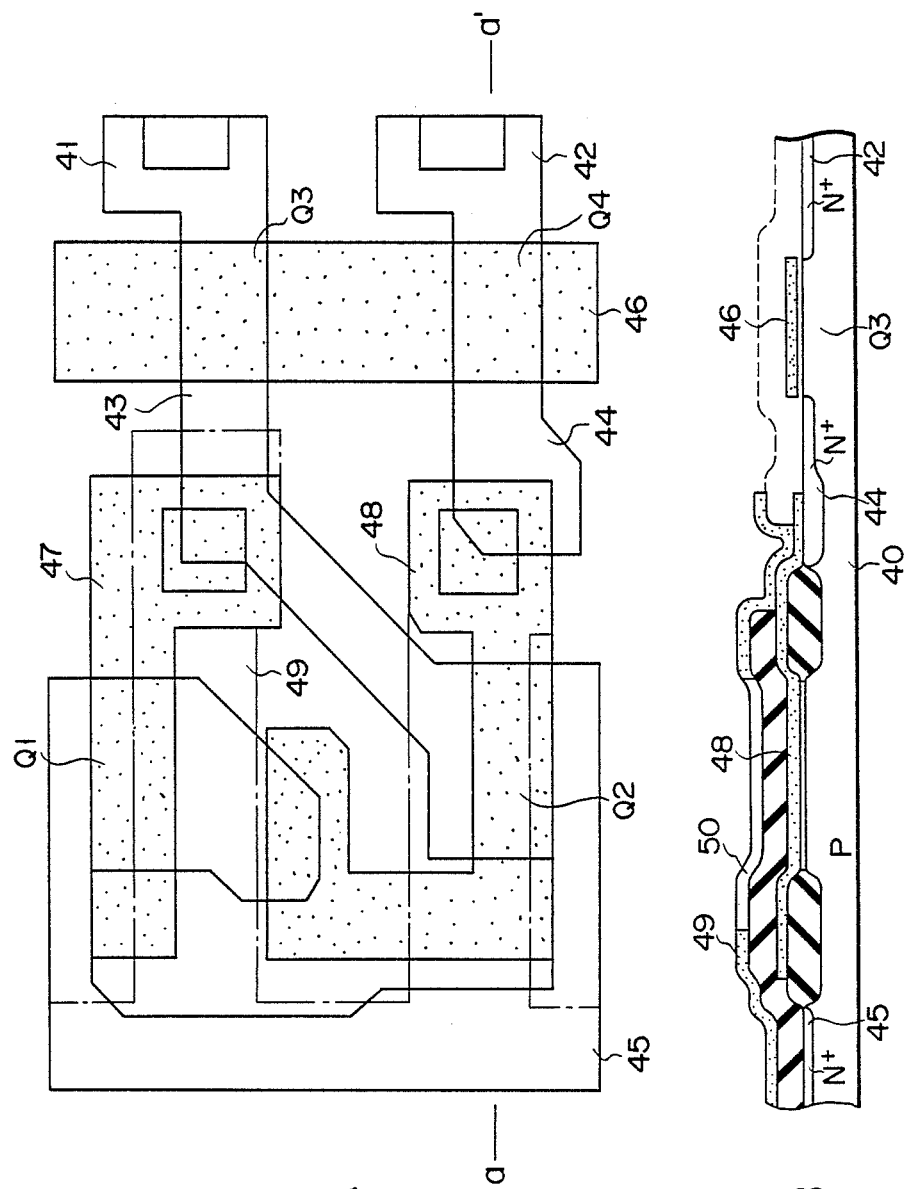
FIG. 7A is a plan view representing the element pattern in a portion of the memory cell illustrated in FIG. 5.
FIG. 7B is a cross-sectional view, taken along line a—a' in FIG. 7B.

FIGS. 7A and 7B illustrates the element pattern of that portion of the memory cell shown in FIG. 5, in which flip-flop circuit F is formed. As is evident from FIG. 7B, this memory cell has P-type well region 40, N+ diffusion regions 41, 42, 43, 44, and 45, and polycrystalline silicon layers 46, 47, 48, and 49. N+ diffusion regions 41 and 42 are the sources or drains of MOS transistors Q3 and Q4, which are connected to bit lines BL and $\overline{BL}$. N+ diffusion regions 43 and 44 are the drains or the sources of transistors Q3 and Q4, and also the drains of MOS transistors Q1 and Q2. N+ diffusion region 45 functions as the common source of MOS transistors Q1 and Q2. Polycrystalline silicon layers 46, 47, and 48 are located in a first plane, and polycrystalline silicon layers 49 is located in a second plane. Layer 46 is used as the gate electrodes of MOS transistors Q3 and Q4. Layer 47 functions as the gate electrode of MOS transistor Q1. Layer 48 functions as the gate electrode of MOS transistor Q2. Polycrystalline silicon layer 49, which is positioned in the second plane and above layers 46 to 48, is used as high-resistance resistors R1 and R2 and also as a connecting line. The region 50 of layer 49 which is used as one of resistors R1 and R2 contains virtually no impurities, and has a resistance of about $10^{12}$ Ω, as has been pointed out.

Another SRAM chip 20 according to the present invention will now be described, with reference to FIG. 8. The same elements as those shown in FIG. 6 are designated at the same reference numerals in FIG. 8, and will now described in detail.

SRAM chip 20 illustrated in FIG. 8 is characterized in switching N-channel MOS transistor 61 is connected between power power-supply voltage lines 11 and 12.

As in the SRAM chip shown in FIG. 6, line 11 is used to apply the power-supply voltage $V_{CC}$ to the peripheral circuits, and line 12 is provided to apply the power-supply voltage $V_{DD}$ to the memory cells of array 21. The gate of this MOS transistor 61 is connected to bonding pad 62.

When the control signal supplied to bonding pad 62 is set at the "0" level, MOS transistor 61 is turned off. Power-supply voltage line 12 is therefore disconnected From power-supply voltage line 11. The power-supply voltage $V_{DD}$ can, therefore, be applied to power-supply voltage line 12 only. On the other hand, when the control signal supplied to bonding pad 62 is set at the "1" level, MOS transistor 61 is turned on. Hence, MOS transistor 61 connects power-supply voltage line 12 to power-supply voltage line 11. As a result, the power-supply voltage $V_{DD}$ can be applied from bonding pad 13 to both power-supply voltage lines 11 and 12 only.

With SRAM chip 20 shown in FIG. 8 it is possible to change the voltage applied via power-supply voltage line 12, merely by adjusting the voltage-level of the control signal supplied to bonding pad 62. More precisely, when the voltage $V_{GG}$ of this control signal is changed to a value less than the voltage $V_{CC}$, the voltage applied via line 12 will fall below the power-supply voltage $V_{CC}$.

Still another embodiment of the invention, i.e., a third SRAM chip 20 will be described with reference to FIG. 9. The same elements as those shown in FIG. 6 are designated at the same reference numerals in FIG. 8, and will now described in detail.

SRAM chip 20 illustrated in FIG. 9 is characterized in that voltage-shifting circuit 63 is coupled between power-supply voltage lines 11 and 12. As in the SRAM chips shown in FIG. 6 and FIG. 8, line 11 is used to apply the power-supply voltage $V_{CC}$ to the peripheral circuits, and line 12 is provided to apply the power-supply voltage $V_{DD}$ to the memory cells of array 21. Voltage-shifting circuit 63 is controlled by the control signal supplied to bonding pad 64 provided within SRAM chip 20.

When the control signal supplied to bonding pad 64 is set at the "0" level, voltage-shifting circuit 63 applies the power-supply voltage $V_{CC}$ to power-supply voltage line 12. Conversely, when the control signal supplied to bonding pad 64 is set at the "1" level, voltage-shifting circuit 63 lowers the power-supply voltage $V_{CC}$ and applies the low voltage to power-supply voltage line 12.

Now, a fourth embodiment of the present invention will be described with reference to FIG. 10, which shows a part of the SRAM chip 20 according to this embodiment. The same elements as those shown in FIG. 9 are designated at the same reference numerals in FIG. 9, and will now described in detail. As is shown in FIG. 10, voltage-shifting circuit 63 is coupled between the power-supply voltage lines (11 and 12) which are provided to apply the power-supply voltage $V_{CC}$ to the peripheral circuits, and to apply the power-supply voltage $V_{DD}$ to the memory cells of array 21. As far as the use of voltage-shifting circuit 63 is concerned, the fourth embodiment is identical to the embodiment that in FIG. 9. Nonetheless, the fourth embodiment is characterized in that circuit 63 is controlled by the control signal output by control-signal generating circuit 65. Circuit 65 comprises a series circuit consisting of load circuit 66 and fuse 67 and coupled between the sources of power-supply voltages $V_{CC}$ and $V_{SS}$.

As long as fuse 67 remains intact, control-signal generating circuit 65 supplies a control signal at the "0" level to voltage-shifting circuit 63. In response to this control signal, circuit 63 applies the power-supply voltage $V_{CC}$ to power-supply voltage line 12. When fuse 67 is cut, control-signal generating circuit 65 supplied a control signal at the "1" level. In response to this control signal, circuit 63 lowers the voltage on power-supply voltage line 11, and applies the lowered voltage to power-supply voltage line 12.

As has been described above, the present invention can provide a static random access memory which has a means of capable of easily and quickly detecting defective memory cells, if any, which have undergone leakage induced cell destruction at low-temperature.

What is claimed is:

1. A static random access memory comprising:
   an array of static memory cells each having resistors functioning as load elements;
   peripheral circuits for controlling the writing of data into, and the reading of data from, the static memory cells;
   a first power-supply voltage line for applying a first power-supply voltage to the peripheral circuit;
   a bonding pad connected to the first power-supply voltage line;
   a second power-supply voltage line for applying a second power-supply voltage to the static memory cells; and
   level-shifting means connected between the first and second power-supply voltage lines, for shifting the level of the first power-supply voltage and applying the level-shifted voltage to the static memory cells via said second power-supply voltage line.

2. The static random access memory according to claim 1, wherein said level-shifting means is an MOS switching element having a gate.

3. The static random access memory according to claim 2, wherein a second bonding pad is provided, and the gate of said MOS switching element is connected to the second bonding pad.

4. The static random access memory according to claim 1, wherein a third bonding pad is provided, and said second power-supply voltage line is connected to the third bonding pad.

5. The static random access memory according to claim 1, wherein said level-shifting means is a voltage-drop circuit.

6. The static random access memory according to claim 5, wherein said voltage-drop circuit operates under the control of a control signal supplied to said second bonding pad.

7. The static random access memory according to claim 5, wherein a control signal generating circuit having a fuse is provided, and said voltage-drop circuit operates under the control of a control signal output by said control signal generating circuit.

8. A static random access memory comprising:
   an array of static memory cells each having resistors functioning as load elements;
   peripheral circuits for controlling the writing of data into, and the reading of data from, the static memory cells;
   a first power-supply voltage line for applying a first power-supply voltage to the memory cells of said array;

a second power-supply voltage line for applying a first power-supply voltage to the peripheral circuits;

a first bonding pad connected to the first power-supply voltage line; and a second bonding pad connected to the second power-supply voltage line.

9. The static random access memory according to claim 8, wherein a voltage lower than the voltage applied to said first bonding pad is supplied to said second bonding pad.

* * * * *